United States Patent
Orbay et al.

(10) Patent No.: US 10,083,264 B1
(45) Date of Patent: Sep. 25, 2018

(54) SYSTEMS AND METHODS FOR IMPLICIT SURFACE MODELING

(71) Applicant: Ansys, Inc., Canonsburg, PA (US)

(72) Inventors: Gunay Orbay, Pittsburgh, PA (US); Joseph Tristano, McMurray, PA (US); Vince M. Pajerski, Canonsburg, PA (US)

(73) Assignee: Ansys, Inc., Canonsburg, PA (US)

( * ) Notice: Subject to any disclaimer, the term of this patent is extended or adjusted under 35 U.S.C. 154(b) by 0 days.

(21) Appl. No.: 14/881,843

(22) Filed: Oct. 13, 2015

Related U.S. Application Data

(60) Provisional application No. 62/063,438, filed on Oct. 14, 2014.

(51) Int. Cl.
*G06T 17/00* (2006.01)
*G06F 17/50* (2006.01)

(52) U.S. Cl.
CPC .............................. *G06F 17/5018* (2013.01)

(58) Field of Classification Search
None
See application file for complete search history.

(56) References Cited

U.S. PATENT DOCUMENTS

2004/0170302 A1* 9/2004 Museth ................. G06T 17/00
382/107

OTHER PUBLICATIONS

B. K. Choi and S. Y. Ju; "Constant-radius blending in surface modelling;" Computer-Aided Design, vol. 21 No. 4 May 1989; pp. 213-220; © 1989 Butterworth & Co Publishers, Ltd; London, GB.*
G. Kós, et al.; "Methods to recover constant radius rolling ball blends in reverse engineering;" Computer Aided Geometric Design 17 (2000); pp. 127-160; 2000 Elsevier Science B.V.*

* cited by examiner

*Primary Examiner* — Edward Martello
(74) *Attorney, Agent, or Firm* — Jones Day

(57) ABSTRACT

Systems and methods are provided for modeling physical objects. Volumetric modeling operations are implemented with implicit surfaces on graphics processing units (GPUs) for Finite Element Analyses. For example, a number of implicit surfaces associated with signed distance fields are determined, and locality information associated with the implicit surfaces is obtained. Whether to blend the implicit surfaces is determined based at least in part on the locality information.

20 Claims, 14 Drawing Sheets

| 1 | 2 | ∪ (1,2) | ∩ (1,2) | / (1,2) |
|---|---|---------|---------|---------|
| ✓ | ✓ | No change | No change | No change |
| ✓ | ✗ | 1 | 2 | 1 |
| ✗ | ✓ | 2 | 1 | 1 |
| ✗ | ✗ | Either | Either | Either |

FIG. 7

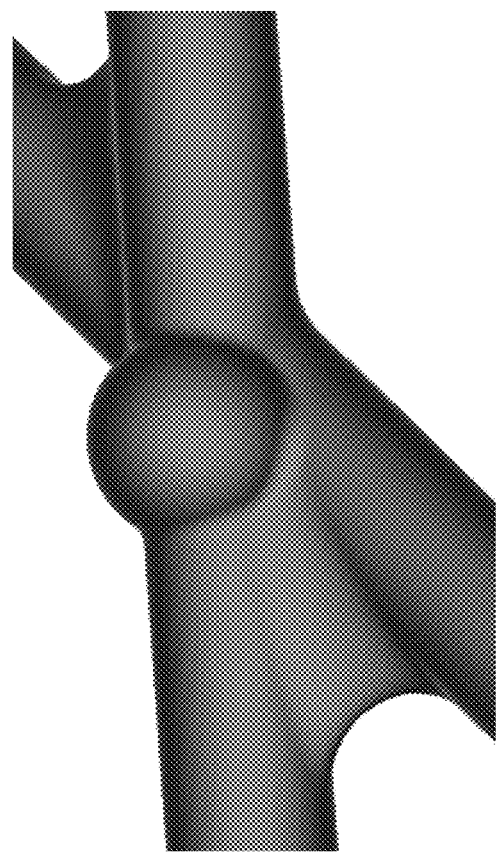
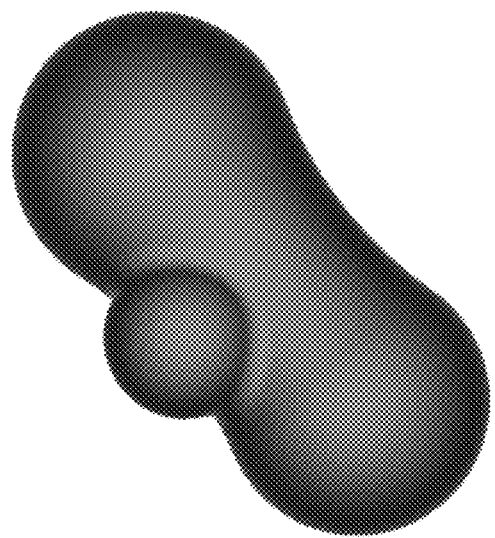
FIG. 11(A)
FIG. 11(B)

SYSTEMS AND METHODS FOR IMPLICIT SURFACE MODELING

CROSS REFERENCE TO RELATED APPLICATIONS

This application claims priority to U.S. Patent Application No. 62/063,438, filed Oct. 14, 2014, the entirety of which is herein incorporated by reference.

TECHNICAL FIELD

The present disclosure relates generally to the field of computational simulations, and, more specifically, to processor-implemented systems and methods for finite element analysis.

BACKGROUND

Many technologies have been developed for computer aided design (CAD). For example, non-uniform rational basis spline (NURBS) technology is widely used for CAD applications. By definition, NURBS are parametric surfaces that are defined as tensor products of polynomial functions and a set of control points in a three-dimensional (3D) space. NURBS can represent a wide range of surfaces though complicated structures may require patches of such surfaces to be trimmed and joined together. However, NURBS has some disadvantages, when it is used for Finite Element Analysis. For example, due to polynomial definitions associated with NURBS, trimmed and joined surfaces often produce boundaries that are not perfectly joined together. In meshing applications, such imperfections' often need certain algorithms to identify, clean and process to be able to produce a usable discretization.

To remedy the problem, the numerical accuracy of the surfaces can be increased. However, high order curves and surfaces with a large number of control points may need to be created which in turn increases the amount of calculations required to sample points on the surface. Some emerging technologies, such as TSpines, attack this problem through a special treatment of surface topologies at surface boundaries. However, watertight surfaces may be possible through special manual treatment by modifying the surfaces topologies to meet the newly created boundaries and patch transitions. Among others, using boundary representation definitions of volumes to calculate a volumetric discretization may be a main reason that causes the above-noted disadvantages of the conventional NURBS technology.

Implicit surfaces have been studied for several decades as an alternative to boundary representations. As one of the pioneers, Wyvill et al. has proposed extending the Constructive Solid Geometry (CSG) approaches to implicit surfaces (e.g., as described in "Extending the csg tree, warping, blending and Boolean operations in an implicit surface modeling system," by Brian Wyvill, Andrew Guy, Eric Galin, Computer Graphics Forum, Volume 18(2)). A tree structure (e.g., a CSG tree/a BlobTree) similar to a tree of hierarchical CAD operations is formed from analytically defined elements, Boolean operations, and various 3D space warping functions (e.g. twist, stretch). Wyvill et al. also later proposed simplifying the BlobTree by partitioning the space for efficient rendering where only a subset of elements actively contributes to the final geometry (e.g., as described in "Efficient use of the BlobTree for rendering purposes," Mark Fox, Callum Galbraith, Brian Wyvill, SMI 2001 International Conference on Shape Modeling and Applications, 2001). Warping functions may distort a true distance field although the warping functions preserve the smoothness of the field. Such effects may have implications in CAD where accuracy in dimensions is of paramount importance.

Typical blending functions may be introduced in the form of simple mathematical equations to combine multiple implicit surfaces to produce a smooth transition between constituent surfaces. However, a major shortcoming with such approaches stems from the compact definition of the implicit surface as a normalized field. As shown in FIG. 1(A), the width of the normalized field directly affects the characteristics of the resulting blends. Another shortcoming is that such blending functions usually produce bulging at undesirable locations. As shown in FIG. 1(B), the bulging effect is formed when two cylinders are blended together. Prevention of the bulging effect may not be possible due to crude mathematical simplicity of the blending functions.

Gradient-based blending may be used to eliminate the bulging problem while still working with compact definitions. However, such an approach may fail to produce constant and controllable radius across blends as may be required by the application. Similarly, achieving different radii across the geometry may require the width of the compact field to be adjusted between consecutive blending operations. In return, this approach limits the order of blending operation to large-to-small. In addition, common to all blending work, the compact definitions and the blending functions, the resulting fields are not guaranteed to be a true distance field although constituent fields initially are. Meshing applications that heavily depend on distances to the surface may greatly suffer using such fields.

SUMMARY

As disclosed herein, processor-implemented systems and methods are provided for modeling physical objects. An example system includes: a plurality of data processors configured to: determine a first implicit surface associated with a first signed distance field; determine a second implicit surface associated with a second signed distance field; obtain locality information associated with the first implicit surface and the second implicit surface using the first signed distance field and the second signed distance field; determine whether to blend the first implicit surface and the second implicit surface based at least in part on the locality information; and in response to the first implicit surface and the second implicit surface being determined to be blended, generate a blending region for blending the first implicit surface and the second implicit surface. Further, the system includes one or more non-transitory computer-readable storage media configured to store data related to the first implicit surface, data related to the second implicit surface, data related to the locality information and data related to the blending region.

For example, the plurality of data processors are further configured to: determine a first local surface related to the first implicit surface and a second local surface related to the second implicit surface based at least in part on the locality information; determine whether the first local surface intersects the second local surface; in response to the first local surface not intersecting the second local surface, determine not to blend the first implicit surface and the second implicit surface; and in response to the first local surface intersecting the second local surface, determine to blend the first implicit surface and the second implicit surface.

As an example, the plurality of data processors are further configured to generate an octree-based efficient data structure through adaptive refinement. As another example, the plurality of data processors are further configured to use one or more boundary representation surfaces with the first implicit surface and the second implicit surface, where the one or more boundary representation surfaces include parametric surfaces and/or discrete geometry. As yet another example, the plurality of data processors are further configured to perform meshing based at least in part on the first signed distance field and the second signed distance field.

In one embodiment, a processor-implemented system is provided for modeling physical objects. An example system includes: a plurality of data processors configured to: determine a plurality of implicit surfaces associated with signed distance fields; generate one or more tree structures associated with the implicit surfaces, a tree structure including a plurality of nodes; partition a three-dimensional space into a plurality of cells; determine whether the implicit surfaces are present in the cells; in response to the implicit surfaces not being present in the cells, removing one or more nodes from the tree structures based at least in part on one or more simplification rules; and performing traversal of the tree structures for blending the implicit surfaces. The system further includes one or more non-transitory computer-readable storage media configured to store data related to the implicit surfaces, and data related to the tree structures.

In another embodiment, a method is provided for modeling physical objects. The method includes: determining a first implicit surface associated with a first signed distance field; determining a second implicit surface associated with a second signed distance field; obtaining locality information associated with the first implicit surface and the second implicit surface using the first signed distance field and the second signed distance field; determining whether to blend the first implicit surface and the second implicit surface based at least in part on the locality information; and in response to the first implicit surface and the second implicit surface being determined to be blended, generating a blending region for blending the first implicit surface and the second implicit surface.

In yet another embodiment, a method is provided for modeling physical objects. The method includes: determining a plurality of implicit surfaces associated with signed distance fields; generating one or more tree structures associated with the implicit surfaces, a tree structure including a plurality of nodes; partitioning a three-dimensional space into a plurality of cells; determining whether the implicit surfaces are present in the cells; in response to the implicit surfaces not being present in the cells, removing one or more nodes from the tree structures based at least in part on one or more simplification rules; and performing traversal of the tree structures for blending the implicit surfaces.

According to one embodiment, a non-transitory machine-readable storage medium encoded with instructions is provided for commanding one or more data processors to execute operations of a method for modeling physical objects. The method includes: determining a first implicit surface associated with a first signed distance field; determining a second implicit surface associated with a second signed distance field; obtaining locality information associated with the first implicit surface and the second implicit surface using the first signed distance field and the second signed distance field; determining whether to blend the first implicit surface and the second implicit surface based at least in part on the locality information; and in response to the first implicit surface and the second implicit surface being determined to be blended, generating a blending region for blending the first implicit surface and the second implicit surface.

According to one embodiment, a non-transitory machine-readable storage medium encoded with instructions is provided for commanding one or more data processors to execute operations of a method for modeling physical objects. The method includes: determining a plurality of implicit surfaces associated with signed distance fields; generating one or more tree structures associated with the implicit surfaces, a tree structure including a plurality of nodes; partitioning a three-dimensional space into a plurality of cells; determining whether the implicit surfaces are present in the cells; in response to the implicit surfaces not being present in the cells, removing one or more nodes from the tree structures based at least in part on one or more simplification rules; and performing traversal of the tree structures for blending the implicit surfaces.

BRIEF DESCRIPTION OF THE DRAWINGS

FIG. 7 depicts an example diagram showing simplification rules.

FIG. 11(A) and FIG. 11(B) depict example diagrams showing constant radius blends not only between two analytically defined entities but also between previously formed blends.

DETAILED DESCRIPTION

Figure 1B:
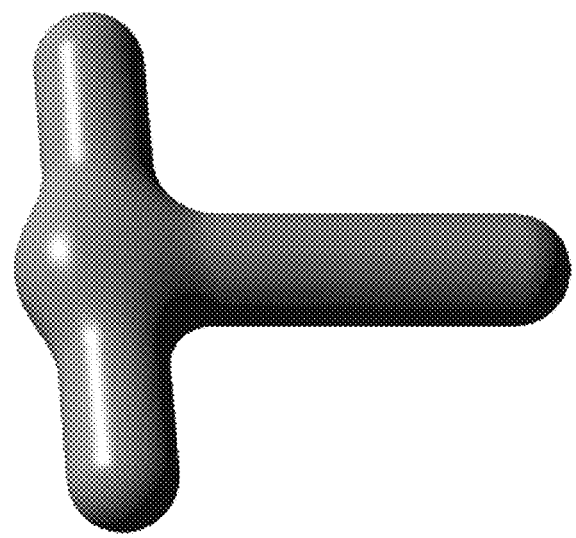
FIG. 1(B) depicts an example diagram showing bulging effects at undesirable locations.
Figure 1A:
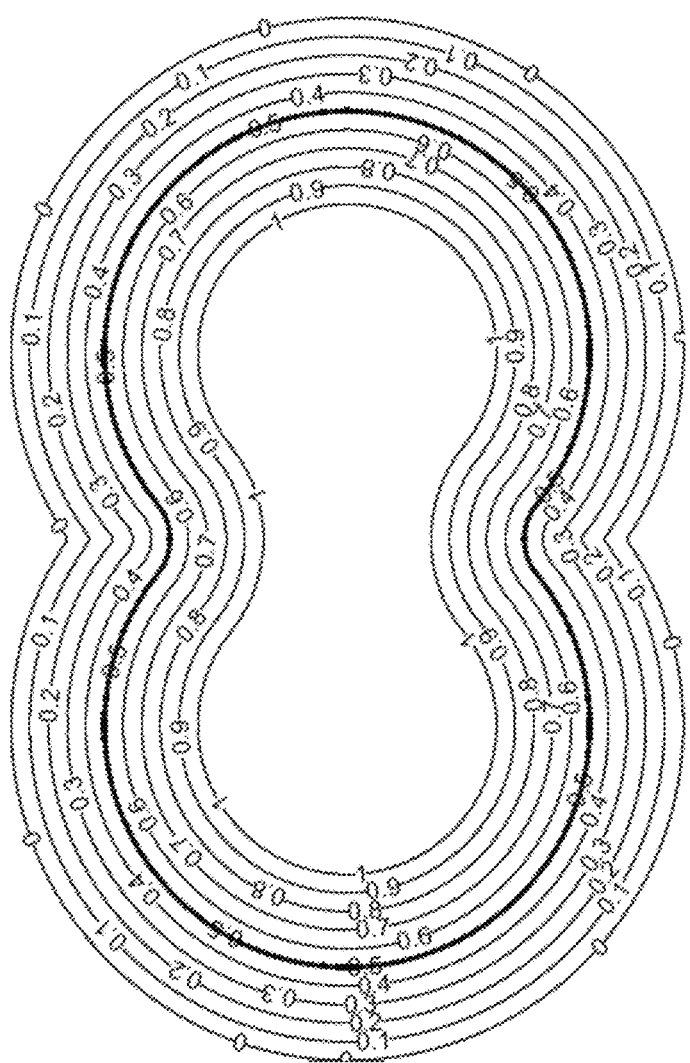
FIG. 1(A) depicts an example diagram showing blending using a compact, normalized field.
Figure 2:
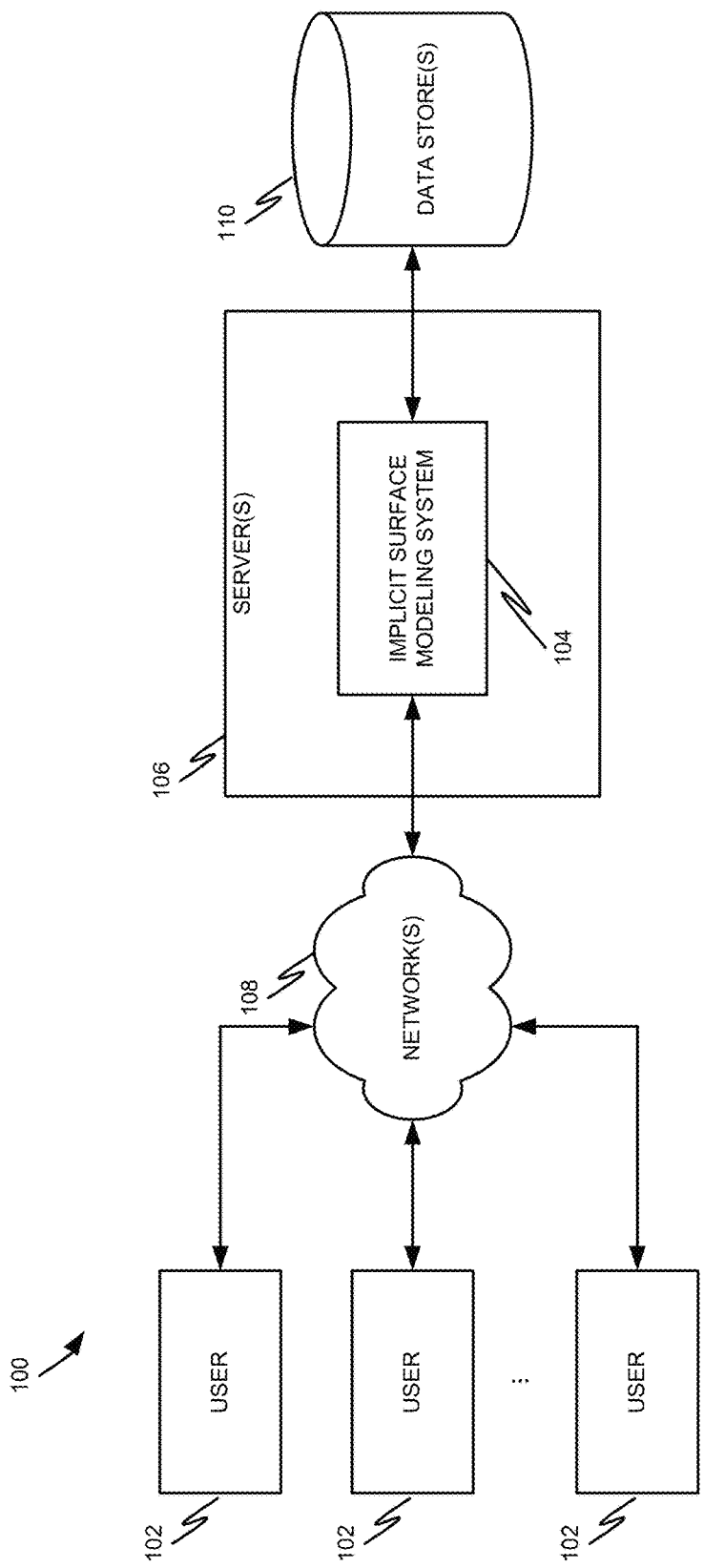
FIG. 2 depicts an example computer-implemented environment wherein users can interact with an implicit surface modeling system hosted on one or more servers through a network.

FIG. 2 depicts an example computer-implemented environment wherein users 102 can interact with an implicit surface modeling system 104 hosted on one or more servers 106 through a network 108. The implicit surface modeling system 104 can assist the users 102 to perform implicit surface modeling, e.g., using one or more graphics processing units (GPUs). Specifically, the implicit surface modeling system 104 enables volumetric modeling operations with implicit surfaces on GPUs that can perform modeling and editing operations similar to boundary representation equivalents. It should be understood that the systems and methods described herein are not limited to GPUs. Any distributed computation platforms or any parallel architectures can be implemented for implicit surface modeling described in the present disclosure.

As shown in FIG. 2, the users 102 can interact with the implicit surface modeling system 104 through a number of ways, such as over one or more networks 108. One or more servers 106 accessible through the network(s) 108 can host the implicit surface modeling system 104. The one or more servers 106 can also contain or have access to one or more data stores 110 for storing data for the implicit surface modeling system 104.

Specifically, the implicit surface modeling system 104 implements one or more GPUs which include specialized electronic circuits designed to rapidly manipulate and alter memory to accelerate the creation of images in a frame buffer intended for output to a display. In certain embodiments, the GPUs are included in the servers 106 for performing implicit surface modeling. Particularly, the GPUs are configured to manipulate computer graphics, and include highly parallel structures for effectively processing large blocks of data in parallel. In some embodiments, the GPUs include various hardware components, such as a number of registers, a number of caches, etc. In specific embodiments, the GPUs include a cluster of CPU nodes, one or more hybrid structures (e.g., Intel Xeon Phi coprocessors), etc.

Figure 3B:
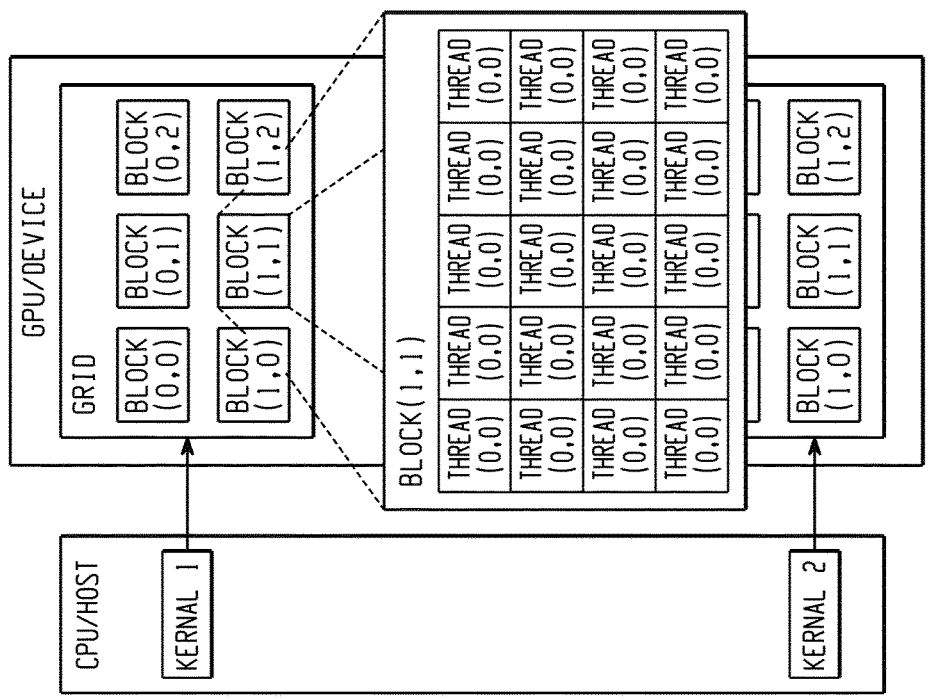
FIG. 3(A) and FIG. 3(B) depict example diagrams showing a GPU architecture for parallel processing.
Figure 3A:
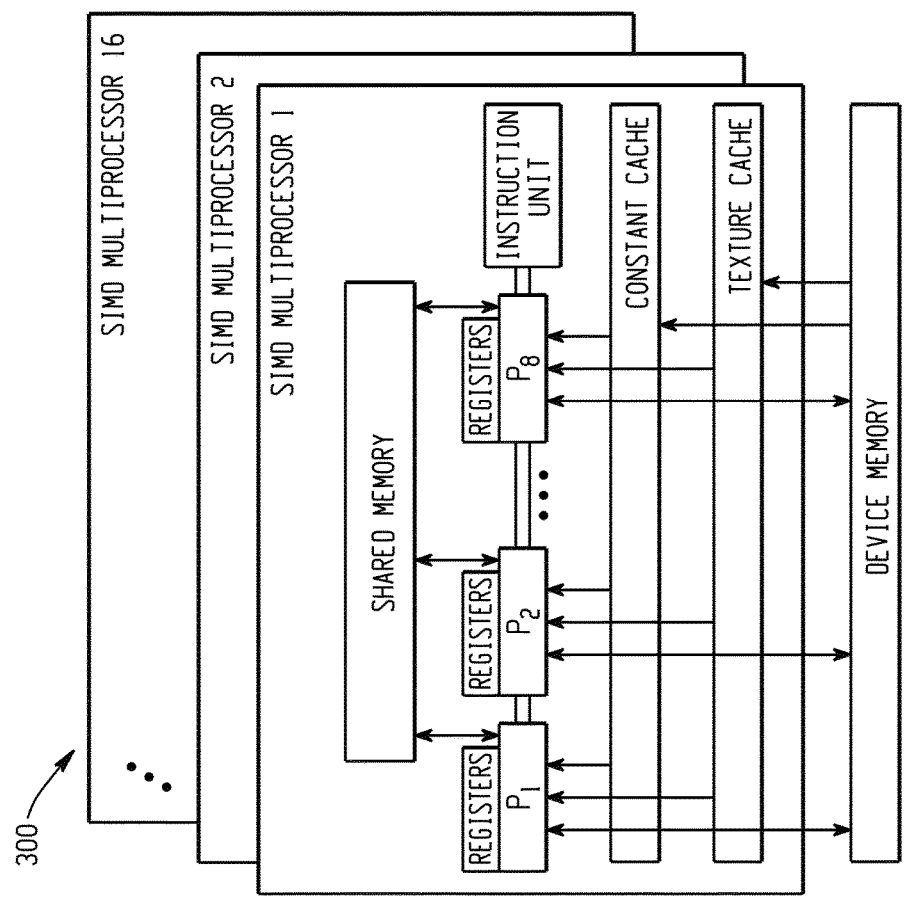

FIG. 3(A) and FIG. 3(B) depict example diagrams showing a GPU architecture for parallel processing. The GPU architecture 300 (e.g., a single-instruction-multiple-data (SIMD) architecture) enables fast execution of parallel threads that share a same machine code and operate on different data points. For high parallelism and large speed gains, the implicit surface modeling system 104 implements certain algorithms to use as few resources as possible while allowing simultaneous execution (e.g., as shown in FIG. 3(A)). For example, the implicit surface modeling system 104 generates machine codes with minimal logical diversions, case specific operations, and a number of registers.

In some embodiments, the implicit surface modeling system 104 divides data into chunks (e.g., blocks) each of which executes a number of parallel threads. A scheduler in a streaming processor or an execution unit runs the same machine codes in thread groups called warps (e.g., as shown in FIG. 3(B)).

Figure 4:
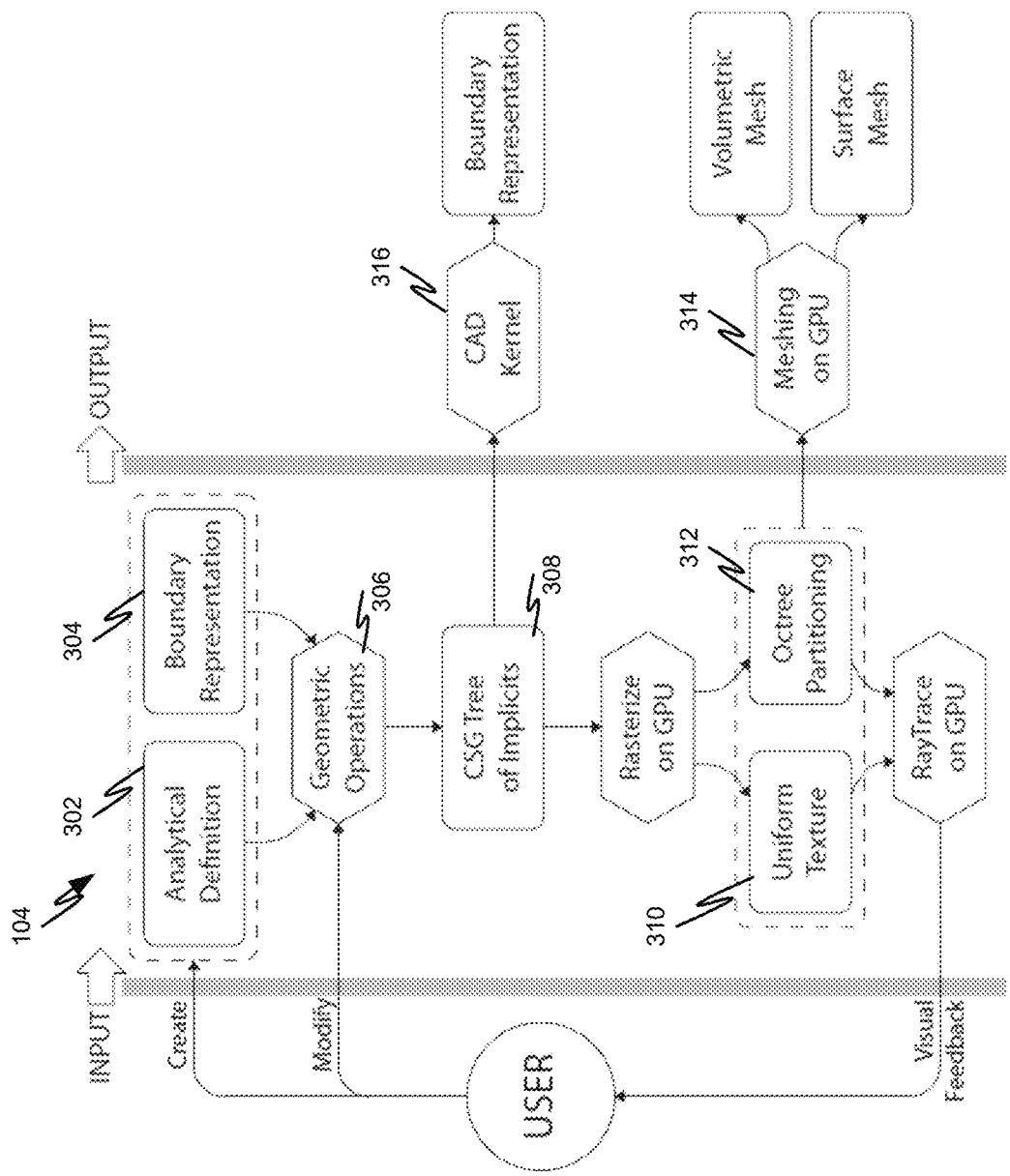
FIG. 4 depicts an example diagram showing an implicit surface modeling system.

FIG. 4 depicts an example diagram showing the implicit surface modeling system 104. Different components and inner workings of the implicit surface modeling system 104 are described in detail as follows.

A. Blending of Implicit Surfaces

As shown in FIG. 4, the implicit surface modeling system 104 accommodates analytically defined implicit surfaces 302 and boundary representation (BRep) surfaces 304 together in a CSG framework. An implicit surface is defined through a spatial mathematical function whose level sets implicitly give rise to the surfaces as:

$$f(x,y,z)=0 \qquad (1)$$

The mathematical function is defined as a signed distance field where f vanishes on the surface. The function has negative distance values inside a volume associated with the surface and positive values outside the volume. As the surface is implicitly defined as a level set of a volumetric function, a search for where an implicit surface may be needed for rendering. As an example, an implicit surface is raytraced by shooting rays from a camera and tracing the values the rays hit in a volume. A normal of the surface is calculated as the gradient of the function (1).

The implicit surface modeling system 104 implements a blending algorithm to create commonly observed constant-radius fillet features both analytically defined implicit surfaces and BRep surfaces. For example, a blending function for blending two implicit surfaces together is determined as follows:

$$f \circ g(x,y,z) = \text{Blending Function}(f,g) \qquad (2)$$

If the implicit function (1) is defined as a signed distance field, Boolean operations (e.g., operations 306 as shown in FIG. 4) can then be determined using the blending function (2):

1. Union (f, g)=Blending Function (f, g)
2. Difference (f, g)=−Union (−f, g)
3. Intersection=−Union (−f, −g)

where (−) sign inverts the sign of the distance field and associated functions (e.g., gradient, Hessian, etc.).

According to some embodiments, the implicit surface modeling system 104 implements Hessian-based blending for producing true constant radius blends and for identifying whether two objects are mistakenly blended or not. For example, the implicit surface modeling system 104 implements the Hessian-based blending to obtain true constant radius features similar to known CAD solutions. In another example, the implicit surface modeling system 104 implements the Hessian-based blending to make blended/not-blended region distinction using locality parameters (e.g., distance, gradient, hessian, etc., of the distance field). In yet another example, the implicit surface modeling system 104 obtains Hessian information to decide whether two surfaces need to be blended or not. In yet another example, the implicit surface modeling system 104 enables the use of a single algorithm throughout the space, which results in highly efficient parallel execution on the GPU architecture 300 (e.g., a SIMD architecture).

Figure 5B:
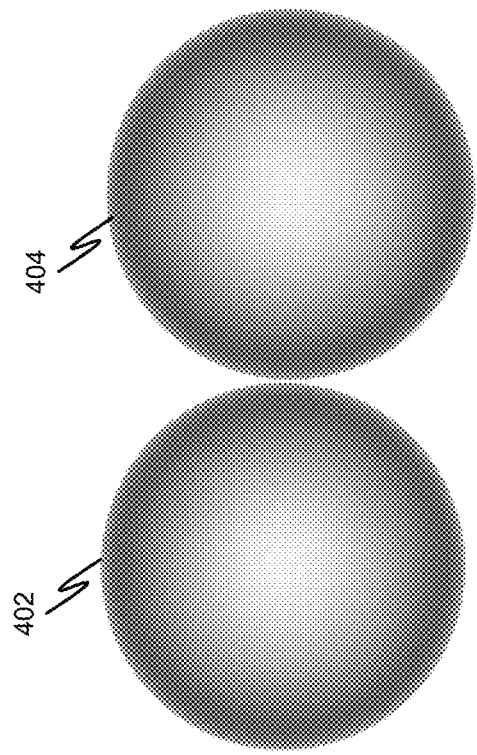
FIG. 5(A) and FIG. 5(B) depict example diagrams showing blending rejection between surfaces.
Figure 5A:
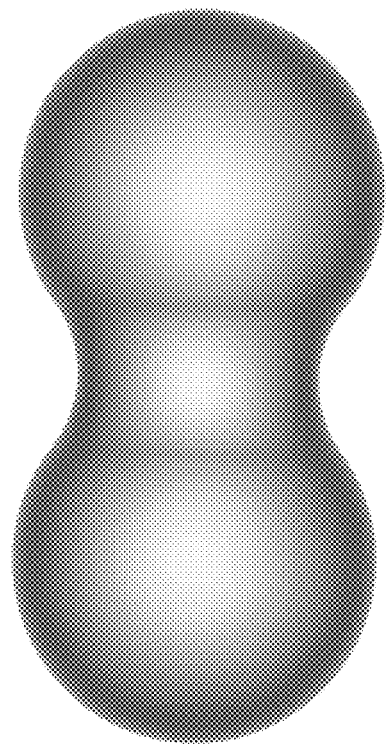

The Hessian information obtained by the implicit surface modeling system 104 directly indicates how the surface progresses at the locality. The Hessian and the gradient of a function are sufficient to fit a local elliptic surface. The implicit surface modeling system 104 is configured to use local fits to determine whether two surfaces need to be blended. Further, the implicit surface modeling system 104 determines where a blending surface is if two surfaces are to be blended. As shown in FIG. 5(A), two spheres 402 and 404 are infinitesimally close yet not intersecting. The implicit surface modeling system 104 determines that the two spheres 402 and 404 do not need to be blended. On the other hand, as shown in FIG. 5(B), when two spheres are intersecting analytically, the implicit surface modeling system 104 blends the two spheres.

Figure 6A:
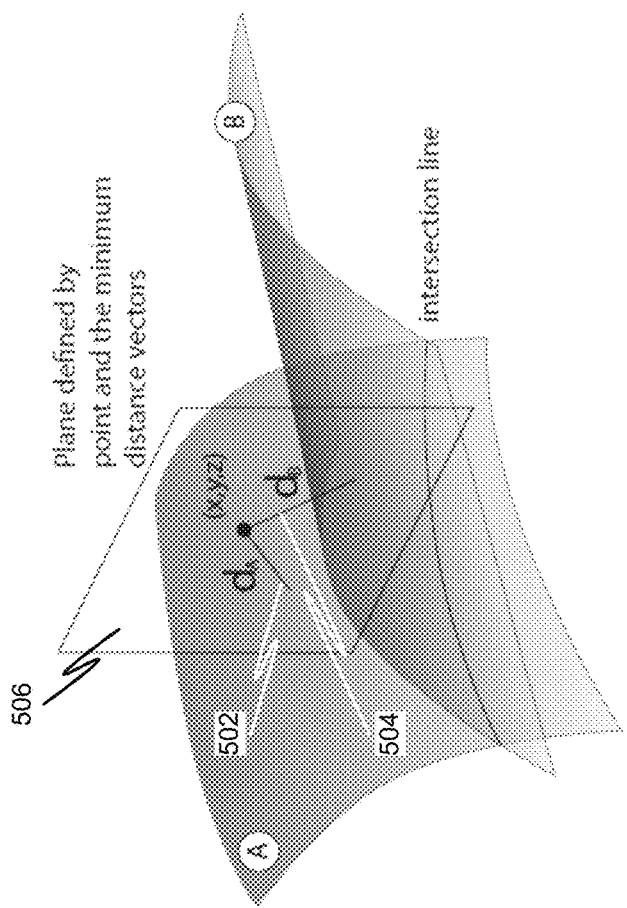
FIG. 6(A) and FIG. 6(B) depict example diagrams showing constant radius blending.
Figure 6B:
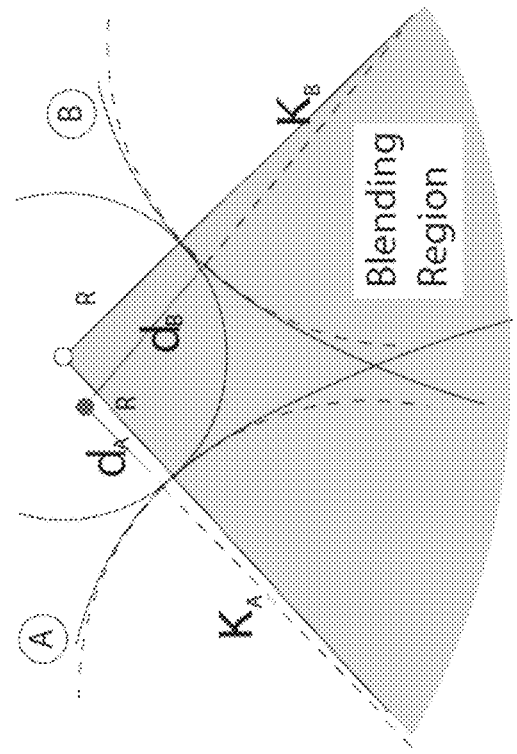

If two surfaces are to be blended, the implicit surface modeling system 104 determines a location of a blend center via curvatures on closest points on both surfaces and associated distances. Once determined, the blend center and the closest points indicate a blending region, as shown in FIG. 6(A) and FIG. 6(B). Particularly, FIG. 6(A) shows that at a given point (x, y, z), two minimum distance vectors 502 (e.g., $d_A$) and 504 (e.g., $d_B$) to the constituent surfaces form a plane 506. FIG. 6(B) shows that the plane 506 formed by the minimum distance vectors 502 and 504 intersects the constituent surfaces in two curves. The curvatures of the curves (e.g., $K_A$ and $K_B$) are used to determine the center point of the blend as well as the blending region.

As an example, the blending of the two surfaces is described in the following pseudo code:

```
BlendingFunction(f(x,y,z),∇f,[Hf],g(x,y,z),∇g,[Hg],R)
```

Construct local surfaces using the point on surface and the curvatures from the Hessians
if locally fitted surfaces do not intersect
   return the surface information with the minimum distance
end if
Calculate the normal of the plane (e.g., a blending plane) formed by distance vectors from (x, y, z) to A and B
Calculate curvatures of A and B on the plane
Calculate the center of the blend as offset from both surfaces by R
Calculate the blending region
if point (x, y, z) is not in the blending region
   return the surface information with the minimum distance
else
   Calculate the derivative of the normal of the blending plane
   Calculate a torus whose ring passes through the blending center with the specified blending radius R and the normal vector variation
   return the surface information of the torus
end if In some embodiments, sharp Booleans may be achieved by specifying the blending radius to be zero while still producing an accurate distance field. This is not the case with primitive Boolean operations based on min/max functions as they inaccurately produce discontinuities in the distance field.

B. Implicit Surface Trees

Figure 8:
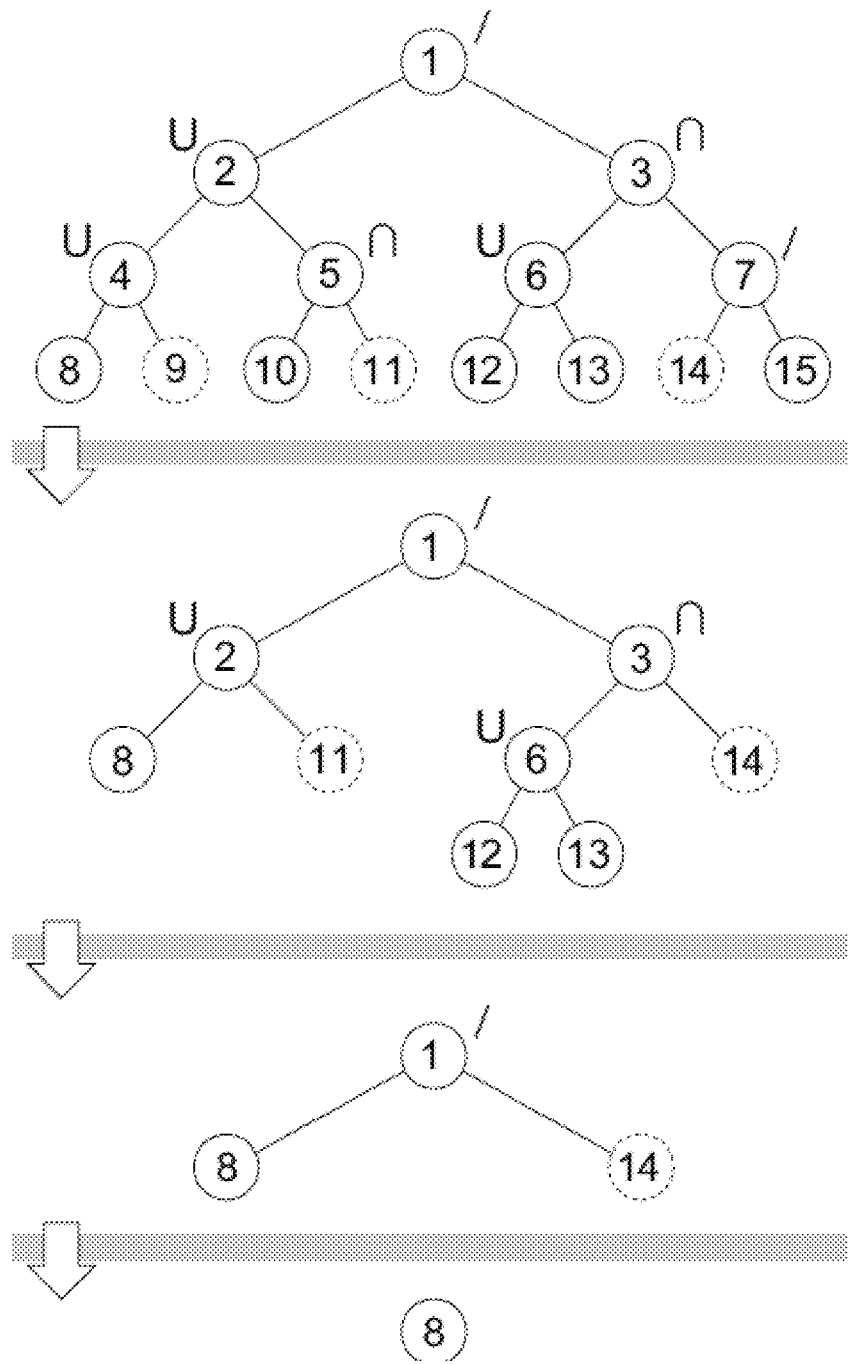
FIG. 8 depicts an example diagram showing simplification of a tree structure.

Referring back to FIG. 3(A) and FIG. 3(B), the implicit surface modeling system 104 implements the GPU architecture 300 (e.g., a SIMD architecture) for parallel calculations. Specifically, the GPU architecture 300 executes same operations on a number of parallel threads in a same data block. For example, the implicit surface modeling system 104 partitions a 3D space into uniform cells each of which rasterizes one or more implicit surfaces using a same implicit surface tree 308 (i.e., a CSG tree). For each such cell, parallel calculations are performed to decide whether the constituent implicit surfaces are in the vicinity or not. If the implicit surfaces are not present in one cell, the CSG tree can be simplified. Table 600 includes an example set of simplification rules for the Boolean operations, as shown in FIG. 7. The first two columns 602 and 604 indicate whether element 1 and element 2 are present in the locality. The rest of Table 600 indicates which node to retain in different scenarios. An example simplification of a tree with 15 nodes is shown in FIG. 8. As shown in FIG. 8, five out of eight leaf nodes are present in the locality. The CSG tree is simplified into a single node. The simplification rules as shown in Table 600 are applied to nodes 4-7 on a first level, nodes 2-3 on a second level, and node 1 on a third level.

Figure 9:
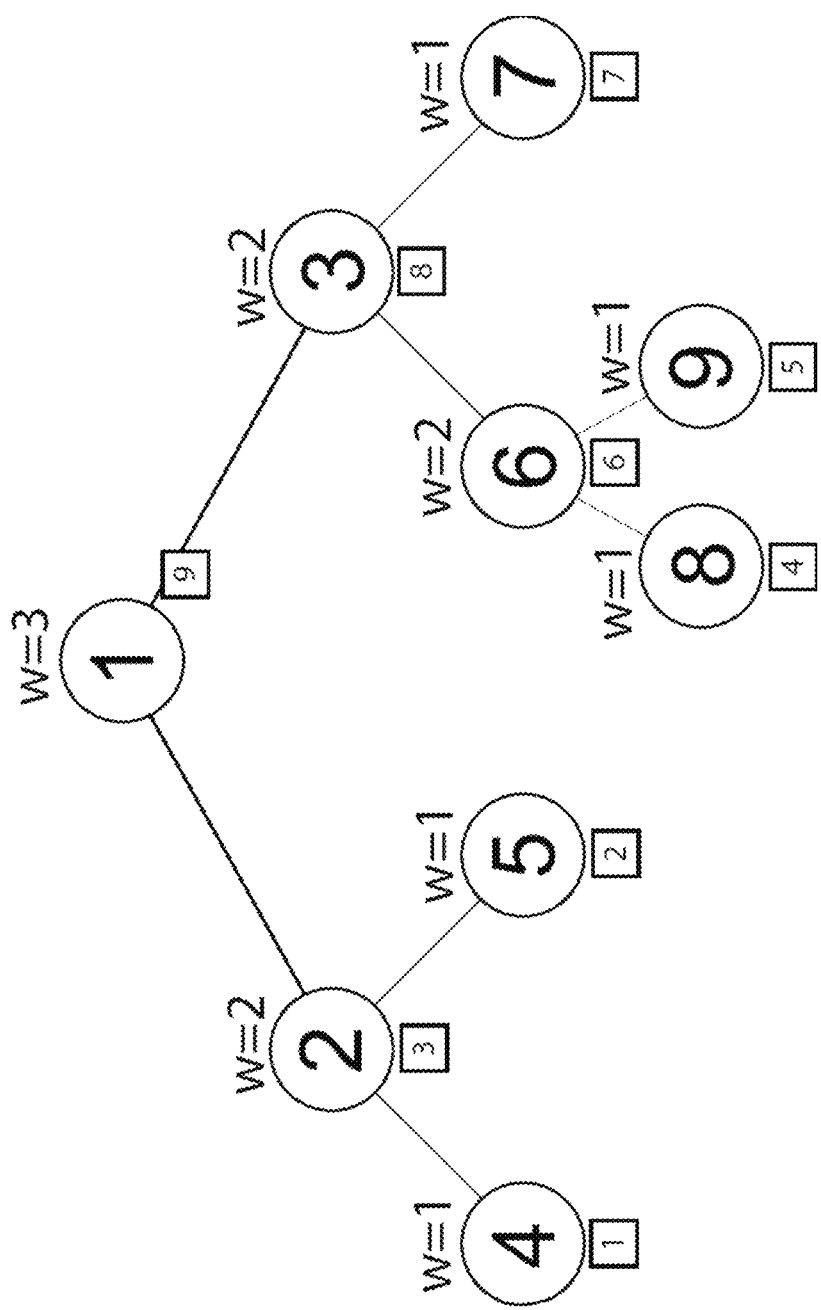
FIG. 9 depicts an example diagram showing required storages to calculate each node in a tree structure.

The pruned trees are used in the associated thread blocks and a same code is executed at every thread. The traversal of the pruned trees on a single GPU may require calculations of geometric elements as well as blending functions. For example, a GPU has limited resources in terms of memory and registers. Since the available number of registers is very small, an efficient traversal of the tree is needed. The implicit surface modeling system 104 calculates how many simultaneous storage spaces, where one storage space holds information regarding a location in terms of its distance, gradient, and Hessian. Then, the implicit surface modeling system 104 calculates, according to the storage spaces, a node ordering that reduces (e.g., minimizes) the number of storage spaces for the given tree. As shown in FIG. 9, the implicit surface modeling system 104 determines required storages for each node in the tree. For example, calculating each leaf node requires one storage space, where calculating a blending may need both children nodes to be in memory. Once the blending is calculated, resulting values can replace one of the children nodes while the other is freed.

As an example, the tree pruning process is described in pseudo code as follows:

```
for every uniform grid cell
   for every geometric element
      Calculate the distance from the center of the cell to the children nodes
      If distance>half of the cell diagonal
         Mark as not present
      end if
   for every Boolean node starting from the bottom level
      If one or more children not present in the cell
         Apply associated simplification rule
      end if
   end for
   for every nodes of the pruned tree starting from the top
      Calculate the node storage requirements
   end for
   Calculate a node order to traverse
end for
```

For example, a rasterization process that traverses the pruned trees is described in pseudo code as follows:

```
for every (x, y, z)
   for every node in the storage ordered list starting from the last
      If analytical element
         Calculate the distance, the gradient and the Hessian
      end if
      if BRep surface element
         Either read from pre-calculated field or calculate
      end if
      if Boolean element
         Calculate the blending
      end if
   end for
end for
```

Though the implicit surfaces are not explicitly defined as in boundary representation geometries, the implicit surface modeling system 104 supports applications that require a unique separation between implicit surfaces and blended regions. For example, the implicit surface modeling system 104 implements a blending function to distinguish between blending regions and the constituent surfaces. When an implicit surface needs to be identified, the implicit surface modeling system 104 searches (e.g., through parallel execution using the GPUs) a volume associated with the implicit surface for points that are in the vicinity of the surface and related to the desired identity. As such, the implicit surface modeling system 104 allows information attached to the implicit surfaces to be efficiently carried to the volumetric representation. This allows points in space, including points on the surface, to be differentiated by the constituent geometric entity from which the points in space originate.

The implicit surface modeling system 104 may convert one or more implicit surfaces to complete signed distance fields so that boundary representation surfaces, such as parametric surfaces and/or discrete geometry (e.g., NURBS, TSplines, faceted surfaces) can be used together with analytically defined implicit surfaces. For example, the implicit surface modeling system 104 converts every BRep into a list of triangles, and recalculates the distance field using one or more GPUs by first processing every triangle in parallel and calculating the distances in the vicinity of the triangle. Then, the implicit surface modeling system 104 calculates distance values in the rest of the 3D space using scan-line algorithms that run along every dimension (x, later y, and finally z) and progressively take into account the three components of the distances. Finally, the implicit surface modeling system 104 marks every location inside and out via shooting rays along a single axis to complete a signed distance field, or by a basic flooding algorithm.

In another example, the implicit surface modeling system 104 calculates the distances as needed which may need a search over the triangles for the closest ones. Specifically, the implicit surface modeling system 104 may perform the search through an octree-based space partitioning, where every octant holds information regarding the contained geometric entities. The implicit surface modeling system 104 may perform the search using an octree-based distance field, where every octant holds information regarding the closest entities. In either case, the implicit surface modeling system 104 performs numerical estimation of gradient information and Hessian information by finite difference formulae.

Figure 10B:
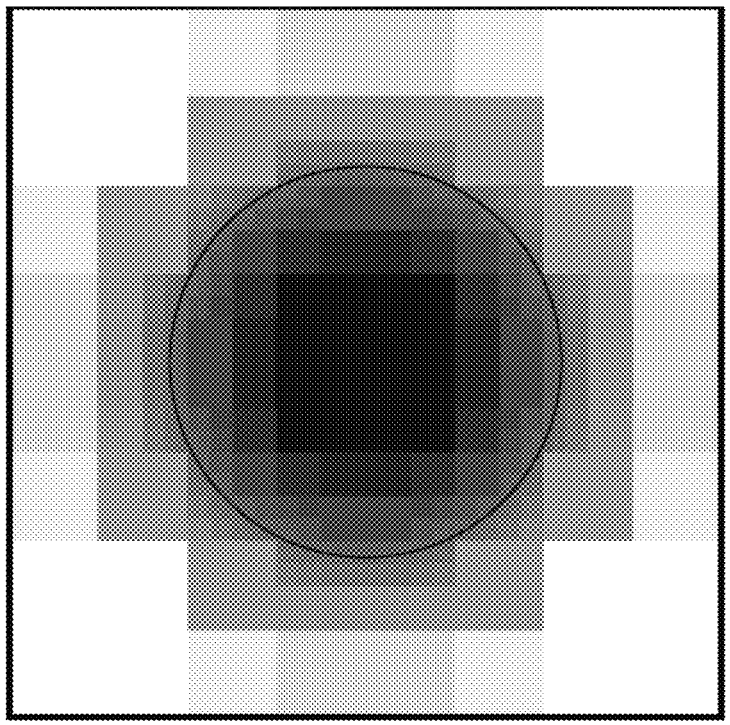
FIG. 10(A) and FIG. 10(B) depict example diagrams showing a full structured grid and a quad-tree in a two-dimensional space, respectively.
Figure 10A:
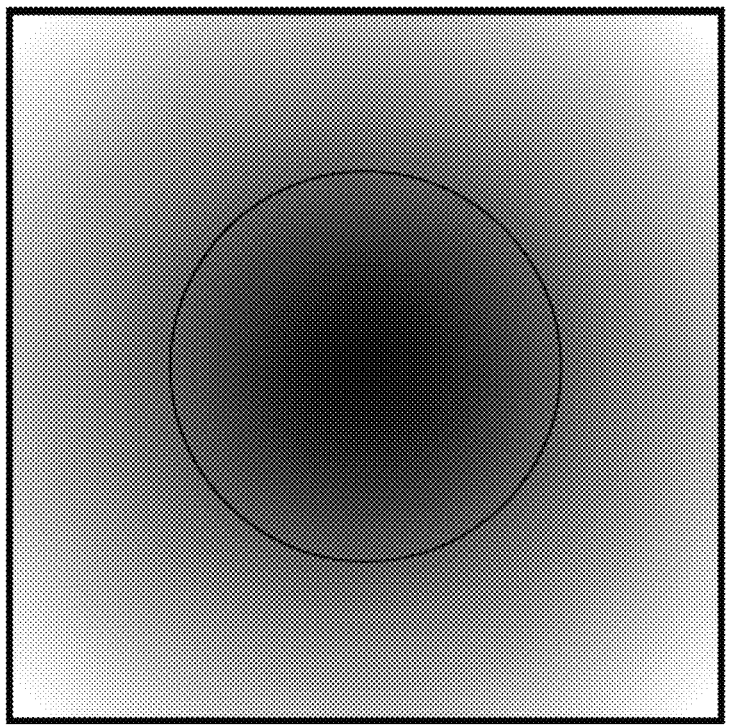

In addition to 3D textures 310 on the GPUs, the implicit surface modeling system 104 supports adaptive refinement to produce octree-based efficient data structures 312. Memory and calculation savings are achieved by skipping octants that are significantly away from the surface. The distance values that are calculated at a level of detail directly indicate whether refinement at the finer level of detail is required. FIG. 10(A) and FIG. 10(B) depict example diagrams showing a full structured grid and a quad-tree in a two-dimensional space, respectively. Storage and computation gains may be significant (e.g., 1.86% of total space and computation workload in this 2D example). A finest level is chosen such that the raytraced such that the raytraced surfaces are identical. As an example, the full grid resolution is 512×512.

The implicit surface modeling system 104 renders one or more implicit surfaces by ray tracing a calculated volume which involves shooting rays from a camera location at every pixel on the screen and searching for f(x, y, z)=0 on the rays. For example, the implicit surface modeling system 104 performs the rendering of the implicit surfaces on the 3D textures (e.g., with hardware accelerated texture lookups and interpolations). In another example, the implicit surface modeling system 104 performs the rendering of the implicit surfaces from octrees, where empty spaces are skipped very quickly during ray tracing.

C. Other Geometric Representations

According to some embodiments, as shown in FIG. 4, the implicit surface modeling system 104 performs meshing 314 using a volumetric representation to directly discretize the volume. Specifically, the implicit surface modeling system 104 performs meshing using various algorithms, such as marching cubes, metric tensor or spherical harmonics methods, hex meshing, Poisson sphere or blue noise type parallel point sampling methods, and Voronoi meshing on sampled points.

According to certain embodiments, the implicit surface modeling system 104 implements an implicit blending hierarchy using a CAD kernel 316 to execute equivalent geometric operations. Alternatively, the implicit surface modeling system 104 leverages topology embedded in a CSG tree to recreate the topology in an equivalent BRep surface. The geometry of the edges and faces can either be faceted geometry or a combination of faceted, analytic, subdivision, or NURBs. The implicit surface modeling system 104 can implement distance fields to store information regarding offset surfaces and medial surfaces. For example, the distance fields can reveal such geometries and help produce surfaces for beam and shell type mesh elements.

According to some embodiments, the implicit surface modeling system 104 couples geometry and mesh to deform/reuse an initial mesh under parametric variations, so as to apply small geometric variations to the produced mesh by volumetrically deforming the mesh elements in a conformal map such that the outer faces coincide with the associated surfaces in the geometry.

Figure 12:
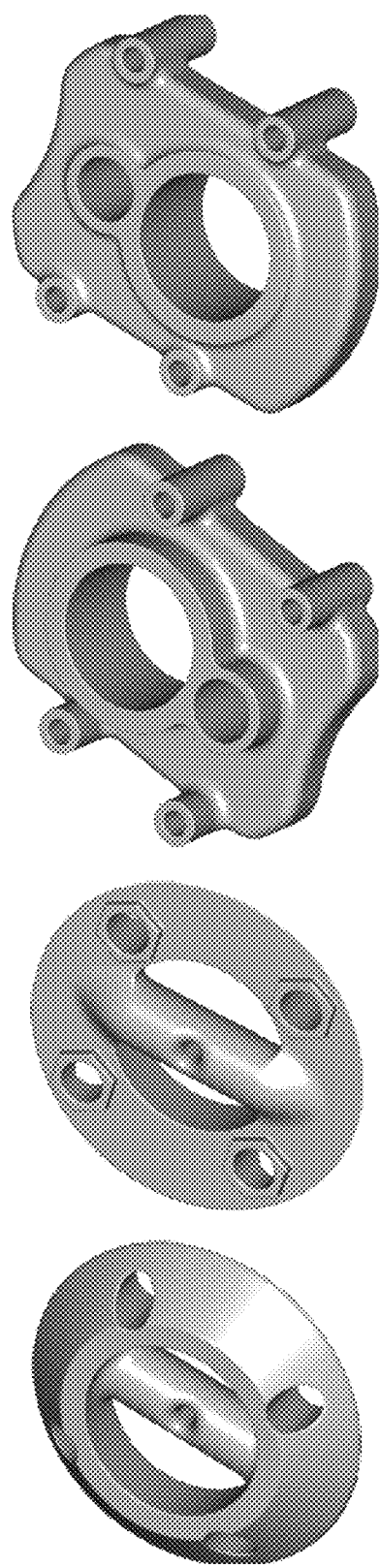
FIG. 12 depicts an example diagram showing mechanical objects modeled by an implicit surface modeling system.

FIG. 11(A) and FIG. 11(B) depict example diagrams showing constant radius blends not only between two analytically defined entities but also between previously formed blends. FIG. 12 depicts an example diagram showing mechanical objects modeled by the implicit surface modeling system 104.

Figure 13:
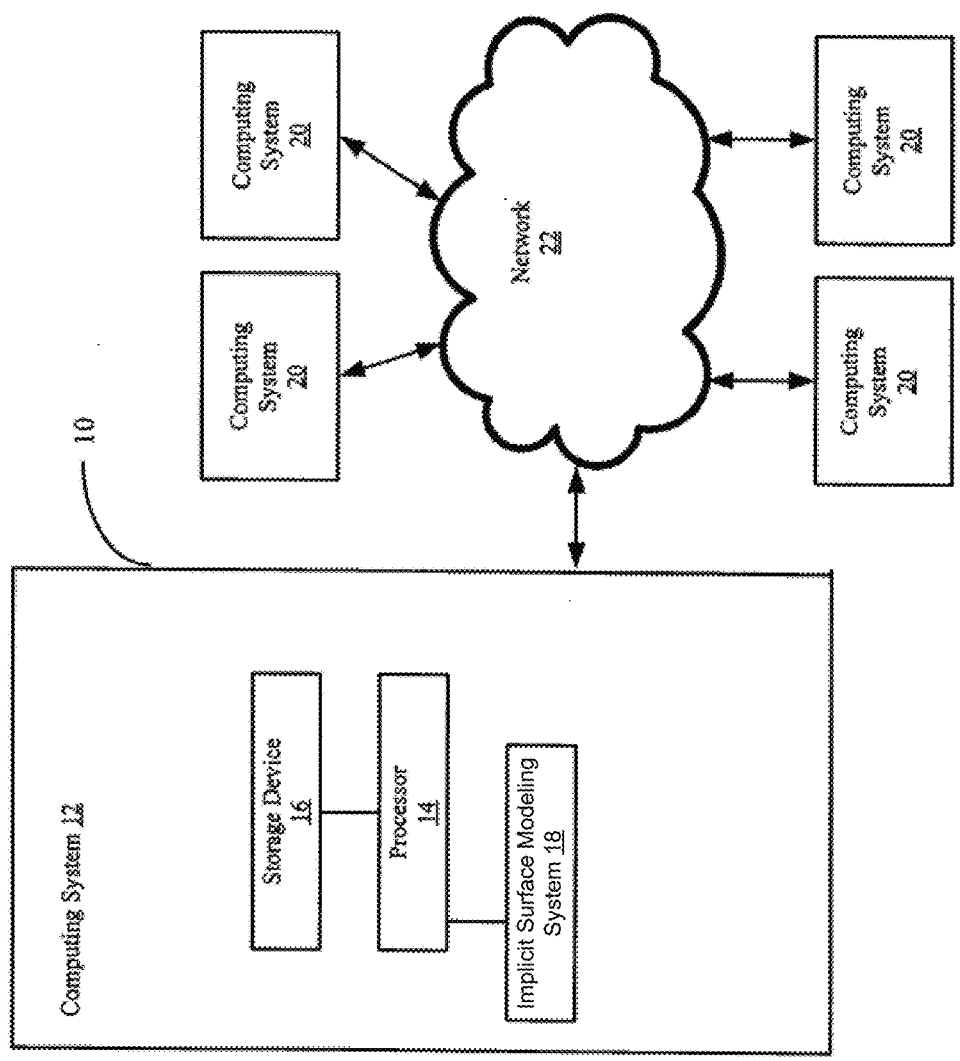
FIG. 13 depicts an example diagram showing a system for implicit surface modeling.

FIG. 13 depicts an example diagram showing a system for implicit surface modeling. As shown in FIG. 13, the system 10 includes a computing system 12 which contains a processor 14, a storage device 16 and an implicit surface modeling module 18. The computing system 12 includes any suitable type of computing device (e.g., a server, a desktop, a laptop, a tablet, a mobile phone, etc.) that includes the processor 14 or provide access to a processor via a network or as part of a cloud based application. The implicit surface modeling module 18 includes tasks and is implemented as part of a user interface module (not shown in FIG. 13).

Figure 14:
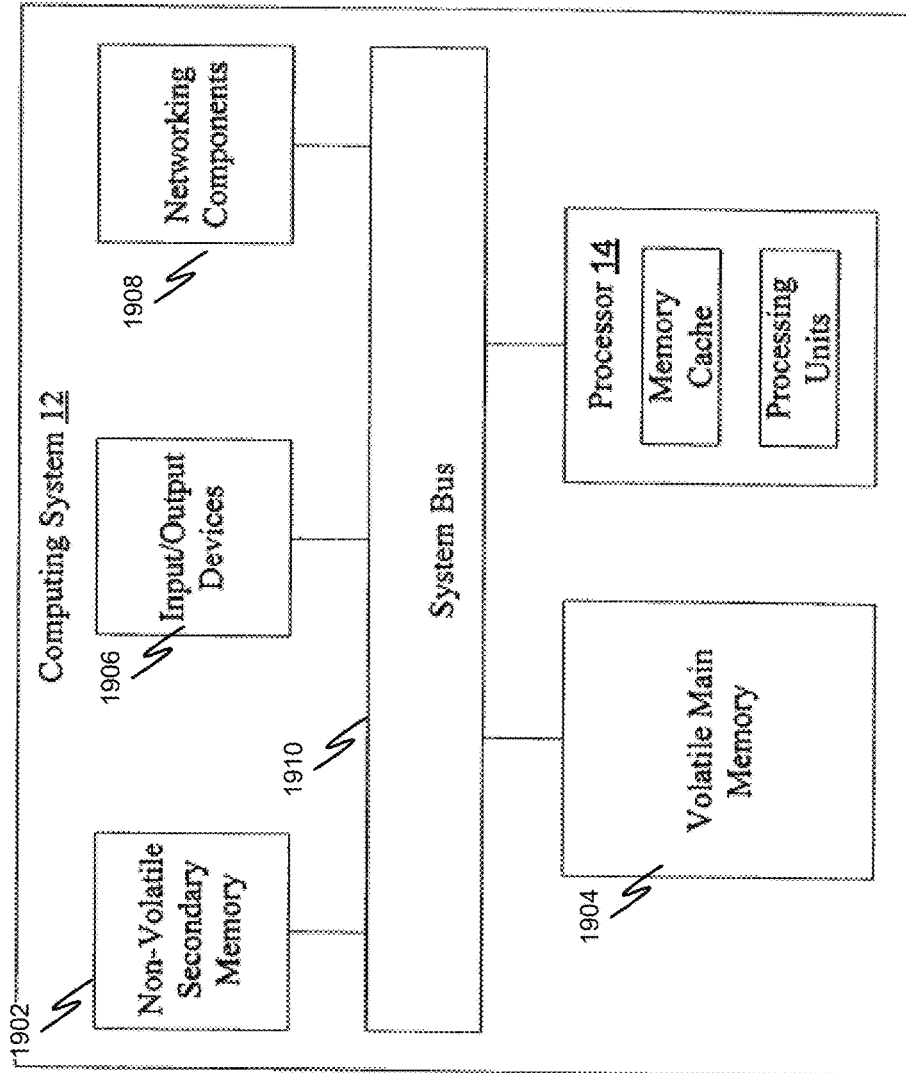
FIG. 14 depicts an example diagram showing a computing system for implicit surface modeling.

FIG. 14 depicts an example diagram showing a computing system for implicit surface modeling. As shown in FIG. 14, the computing system 12 includes a processor 14, memory devices 1902 and 1904, one or more input/output devices 1906, one or more networking components 1908, and a system bus 1910. In some embodiments, the computing system 12 includes the implicit surface modeling module 18, and provides access to the implicit surface modeling module 18 to a user as a stand-alone computer.

This written description uses examples to disclose the invention, including the best mode, and also to enable a person skilled in the art to make and use the invention. The patentable scope of the invention may include other examples. For example, the systems and methods may include data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of non-transitory computer-readable storage medium that is stored at a single location or distributed across multiple locations. The medium can include computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example, as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

The invention claimed is:

1. A processor-implemented system for modeling physical objects, the system comprising:
   one or more non-transitory computer-readable storage media;
   a plurality of data processors coupled to one or more memories and configured to generate an implicit surface model within a 3D volume as a blending of a first implicit surface and a second implicit surface by:
      accessing data defining the first implicit surface and second implicit surface from the one or more non-transitory computer-readable storage media;
      determining a first implicit surface associated with a first signed distance field, the first implicit surface being analytically defined;
      determining a second implicit surface associated with a second signed distance field, the second implicit surface being analytically defined;
      obtaining locality information associated with the first implicit surface and the second implicit surface using the first signed distance field and the second signed distance field;
      determining whether to blend the first implicit surface and the second implicit surface based at least in part on the locality information; and
      in response to the first implicit surface and the second implicit surface being determined to be blended, generate a blending region including a constant radius function for blending the first implicit surface and the second implicit surface,
      wherein two or more of the plurality of data processors are implemented in parallel for performing parallel calculations and locality information is obtained at a plurality of points in space in parallel and is determined independently for each of the points in space using parallel operating logic units, and wherein surface information of the implicit surface model is generated by:
         partitioning the 3D volume into a plurality of uniform 3D cells each respectively associated with one of the plurality of points in space; and
         concurrently processing two or more uniform 3D cells of the plurality of uniform 3D cells, using respectively two or more of the plurality of data processors each executing the same instructions, to return surface information of the implicit surface model associated with each respective 3D cell, independently of any other 3D cell;
         storing the implicit surface model in memory intended to be output for display, wherein the stored implicit surface model comprises the surface information returned from the two or more uniform 3D cells, wherein the implicit surface model is displayed on a display.

2. The system of claim 1, wherein the plurality of data processors are further configured to:
   calculate one or more Boolean operations for the first implicit surface and the second implicit surface using a blending function associated with the first signed distance field and the second signed distance field.

3. The system of claim 1, wherein:
   the first implicit surface corresponds to a first function related to the first signed distance field;
   the first function corresponds to one or more first negative values inside a first volume associated with the first implicit surface and one or more first positive values outside the first volume;
   the second implicit surface corresponds to a second function related to the second signed distance field; and
   the second function corresponds to one or more second negative values inside a second volume associated with the second implicit surface and one or more second positive values outside the second volume.

4. The system of claim 1, wherein:
   the locality information includes first Hessian information and first gradient information of the first implicit surface; and
   the locality information includes second Hessian information and second gradient information of the second implicit surface.

5. The system of claim 1, wherein the plurality of data processors are further configured to:
   determine a first local surface related to the first implicit surface and a second local surface related to the second implicit surface based at least in part on the locality information;
   determine whether the first local surface intersects the second local surface;

in response to the first local surface not intersecting the second local surface, determine not to blend the first implicit surface and the second implicit surface; and in response to the first local surface intersecting the second local surface, determine to blend the first implicit surface and the second implicit surface.

6. The system of claim 5, wherein the plurality of data processors are further configured to, in response to the first local surface intersecting the second local surface:

determine a local point;

determine a first distance vector representing a first distance between the local point and the first local surface;

determine a second distance vector representing a second distance between the local point and the second local surface;

determine a blending plane based at least in part on the first distance vector and the second distance vector;

calculate a first curvature associated with the first local surface;

calculate a second curvature associated with the second local surface;

calculate a blend center that has equal blend distances with the first local surface and with the second local surface; and calculate the blending region based at least in part on the blend center and the blend distances.

7. The system of claim 1, wherein the plurality of data processors include one or more graphics processing units.

8. The system of claim 1, wherein the plurality of data processors are further configured to generate an octree-based efficient data structure through adaptive refinement.

9. The system of claim 1, wherein the plurality of data processors are further configured to use one or more boundary representation surfaces with the first implicit surface and the second implicit surface.

10. The system of claim 9, wherein the one or more boundary representation surfaces include parametric surfaces and discrete geometry.

11. The system of claim 1, wherein the plurality of data processors are further configured to perform meshing based at least in part on the first signed distance field and the second signed distance field.

12. The processor-implemented system of claim 1, wherein to return surface information of the implicit surface model associated with each respective 3D cell, independently of any other 3D cell, includes:

when the first implicit surface and the second implicit surface do not intersect, returning surface information associated with a closer surface of the first implicit surface and the second implicit surface as the implicit surface model surface information associated with the respective 3D cell;

when the first implicit surface and the second implicit surface intersect and the respective 3D cell is not within the blending region, returning surface information associated with a closer surface of the first implicit surface and the second implicit surface as the implicit surface model surface information associated with the respective 3D cell; and when the first implicit surface and the second implicit surface intersect and the respective 3D cell is within the blending region, return surface information associated with the constant radius function as the implicit surface model surface information associated with the respective 3D cell.

13. A processor-implemented system for modeling physical objects, the system comprising:

one or more non-transitory computer-readable storage media configured to store data related to implicit surface models and data related to tree structures;

a plurality of data processors configured to:

access the data related to implicit surface models and data related to tree structures;

determine, from the data related to implicit surface models, a plurality of implicit surfaces associated with signed distance fields, the plurality of implicit surface being analytically defined;

generate one or more tree structures associated with the implicit surfaces, a tree structure including a plurality of nodes;

partition a three-dimensional space into a plurality of cells;

determine, using the plurality of data processors organized in a single-instruction-multiple-data architecture, whether the implicit surfaces are present in the cells by:

accessing, with each processor of the plurality of data processors, a respective cell of the plurality of cells;

in response to the implicit surfaces not being present in the respective cell, removing, using a respective data processor, one or more nodes from the tree structures based at least in part on one or more simplification rules;

in response to two or more implicit surfaces being present in the respective cell, updating the one or more tree structures by replacing at least one node with a node containing surface information generated by blending the implicit surfaces based on a constant radius function; and rasterizing the implicit surface model based on the updated one or more tree structures, wherein the rasterized implicit surface model is displayed on a display.

14. The system of claim 13, wherein the plurality of implicit surfaces correspond to a plurality of functions related to the signed distance fields.

15. The system of claim 14, wherein a function related to the signed distance fields corresponds to one or more negative values inside a volume associated with an implicit surface and one or more positive values outside the volume.

16. The system of claim 13, wherein the plurality of data processors include one or more graphics processing units.

17. A processor-implemented method for modeling physical objects, the method comprising:

determining, using a plurality of data processors, a first implicit surface associated with a first signed distance field, the first implicit surface being analytically defined;

determining, using the plurality of data processors, a second implicit surface associated with a second signed distance field, the second implicit surface being analytically defined;

obtaining, using the plurality of data processors in parallel, locality information associated with the first implicit surface and the second implicit surface using the first signed distance field and the second signed distance field for each point in a 3D space, such that each point in the 3D space is associated with locality information independently of each other point in the 3D space using parallel operating logic units;

determining, using the plurality of data processors, whether to blend the first implicit surface and the second implicit surface based at least in part on the locality information; and in response to the first implicit surface and the second implicit surface being determined to be blended, generating, using the plurality of data processors, a blending region based on a constant radius function for blending the first implicit surface and the second implicit surface;
performing parallel calculations to generate surface information of the implicit surface model by:
   partitioning a 3D volume into a plurality of uniform 3D cells each respectively associated with one of the plurality of points in space;
   concurrently processing two or more uniform 3D cells of the plurality of uniform 3D cells using respectively two or more of the plurality of data processors each executing the same instructions to return surface information of the implicit surface model associated with each respective 3D; and
storing the implicit surface model including the surface information in a memory intended to be output for display, wherein the implicit surface model is displayed on a display.

18. A processor-implemented method for modeling physical objects, the method comprising:
determining, using a plurality of data processors, a plurality of implicit surfaces associated with signed distance fields, the plurality of implicit surface being analytically defined;
generating, using the plurality of data processors, one or more tree structures associated with the implicit surfaces, a tree structure including a plurality of nodes;
partitioning, using the plurality of data processors, a three-dimensional space into a plurality of cells;
determining, using the plurality of data processors organized in a single-instruction-multiple-data architecture, whether the implicit surfaces are present in the cells by:
   accessing, with each processor of the plurality of data processors, a respective cell of the plurality of cells;
   in response to the implicit surfaces not being present in the respective cell, removing, using a respective data processors, one or more nodes from the tree structures based at least in part on one or more simplification rules; and
   in response to two or more implicit surfaces being present in the cell, replacing at least one node with a node containing surface information generated by blending the implicit surfaces based on the constant radius function; and
rasterizing the implicit surface model based on the updated one or more tree structures, wherein the rasterized implicit surface model is displayed on a display.

19. A non-transitory machine-readable storage medium encoded with instructions for commanding one or more data processors to execute operations of a method for modeling physical objects, the method comprising:
determining a first implicit surface associated with a first signed distance field, the first implicit surface being analytically defined;
determining a second implicit surface associated with a second signed distance field, the second implicit surface being analytically defined;
obtaining locality information associated with the first implicit surface and the second implicit surface at a plurality of points in space in parallel using the first signed distance field and the second signed distance field, wherein the locality information is determined independently for each of the points in space using parallel operating logic units;
determining whether to blend the first implicit surface and the second implicit surface based at least in part on the locality information; and
in response to the first implicit surface and the second implicit surface being determined to be blended, generating a blending region based on a constant radius function for blending the first implicit surface and the second implicit surface;
performing parallel calculations to generate surface information of the implicit surface model by:
   partitioning a 3D volume into a plurality of uniform 3D cells each respectively associated with one of the plurality of points in space;
   concurrently processing two or more uniform 3D cells of the plurality of uniform 3D cells using respectively two or more of the plurality of data processors each executing the same instructions to return surface information of the implicit surface model associated with each respective 3D; and
storing implicit surface model including the surface information in a memory intended to be output for display, wherein the implicit surface model is displayed on a display.

20. A non-transitory machine-readable storage medium encoded with instructions for commanding one or more data processors to execute operations of a method for modeling physical objects, the method comprising:
determining a plurality of implicit surfaces associated with signed distance fields, the plurality of implicit surface being analytically defined;
generating one or more tree structures associated with the implicit surfaces, a tree structure including a plurality of nodes;
partitioning a three-dimensional space into a plurality of cells;
determining, using a plurality of data processors organized in a single-instruction-multiple-data architecture, whether the implicit surfaces are present in the cells by:
accessing, with each processor of the plurality of data processors, a respective cell of the plurality of cells;
in response to the implicit surfaces not being present in the respective cell, removing, using a respective data processor, one or more nodes from the tree structures based at least in part on one or more simplification rules; and
in response to two or more implicit surfaces being present in the cell, replacing at least one node with a node containing surface information generated by blending the implicit surfaces based on the constant radius function; and
rasterizing the implicit surface model based on the updated one or more tree structures, wherein the rasterized implicit surface model is displayed on a display.

* * * * *